(12) United States Patent
Kovalevskii et al.

(10) Patent No.: US 6,532,161 B2
(45) Date of Patent: Mar. 11, 2003

(54) POWER SUPPLY WITH FLUX-CONTROLLED TRANSFORMER

(75) Inventors: Dmitri Kovalevskii, Fort Collins, CO (US); Michael Kishinevsky, Manalapay, NJ (US); David J. Christie, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 0 days.

(21) Appl. No.: 09/890,814

(22) PCT Filed: Dec. 6, 2000

(86) PCT No.: PCT/US00/33038

§ 371 (c)(1),
(2), (4) Date: Nov. 13, 2001

(87) PCT Pub. No.: WO01/43267

PCT Pub. Date: Jun. 14, 2001

(65) Prior Publication Data

US 2002/0158616 A1 Oct. 31, 2002

Related U.S. Application Data

(60) Provisional application No. 60/169,441, filed on Dec. 7, 1999.

(51) Int. Cl.[7] ............................................. H02M 7/122
(52) U.S. Cl. ........................................... 363/55; 363/95
(58) Field of Search ....................... 363/55, 56.01, 363/95, 97, DIG. 1

(56) References Cited

U.S. PATENT DOCUMENTS

| | | | |
|---|---|---|---|
| 3,678,367 A | | 7/1972 | McMurray |
| 3,697,855 A | * | 10/1972 | Kernick et al. |
| 4,124,885 A | * | 11/1978 | Nordby ...................... 363/56 |
| 4,150,424 A | * | 4/1979 | Nuechterlein ................ 363/97 |
| 4,404,623 A | * | 9/1983 | Jourdan ...................... 363/56 |
| 4,439,822 A | * | 3/1984 | Cocconi ...................... 363/56 |
| 4,500,408 A | * | 2/1985 | Boys et al. ................. 204/298 |
| 4,866,589 A | | 9/1989 | Sato et al. |
| 4,933,380 A | | 6/1990 | Sato et al. |
| 6,183,605 B1 | * | 2/2001 | Schatz ................... 204/192.12 |

* cited by examiner

*Primary Examiner*—Jeffrey Sterrett
(74) *Attorney, Agent, or Firm*—Benjamin Hudson, Jr.

(57) ABSTRACT

There is provided by this invention an apparatus and method for generating voltage pulses to first and second magnetron devices in a plasma chamber. An isolation transformer is connected to a pulsed DC power supply having a flux sensor, such as a Hall effect sensor, in close proximity to its air gap to monitor the transformer flux. A control circuit is connected to the flux sensor to control the duty cycle of the transformer by controlling the flux of the transformer such that the maximum and minimum peak transformer fluxes are equal in magnitude and opposite in sign to prevent saturation.

6 Claims, 9 Drawing Sheets

POWER SUPPLY WITH FLUX-CONTROLLED TRANSFORMER

CROSS-REFERENCE TO RELATED APPLICATIONS

This application is related to and claims the benefit of priority of the commonly assigned provisional application Ser. No. 60/169,441 filed Dec. 7, 1999, the contents of which are incorporated herein by reference.

BACKGROUND OF THE INVENTION

1. Field of the Invention

The present invention relates generally to the control of the delivery of power in a variety of applications, and more particularly to methods and systems to deliver and control pulsed power as may be applicable to plasma thin film processing and other applications.

2. Brief Description of the Prior Art

Thin film layer systems are commonly deposited on glass or polymer substrates with a large area coater. These layer systems are often an implementation of an optical filter. These filters use a combination of interference effects and the transmission and reflection spectra of the discrete metal and dielectric layers to arrive at their composite spectral transmission and absorption characteristics. The metallic layers, commonly titanium, silver, nichrome, aluminum or stainless steel, are typically sputtered with a magnetron operating in the metallic mode in an argon gas environment and powered by a DC supply as described in the book by R. J. Hill, S. J. Nadel, "Coated glass applications and markets", BOC (1999), p.55–86

A process known as reactive sputtering, where a metal or semiconductor is sputtered in the presence of a reactive gas, typically oxygen or nitrogen, deposits the dielectric layers. The gas then combines with the conductive sputtered material to form a dielectric. This dielectric tends to be deposited on the sputtering target and anode as well as the work piece. The result is an insulating coating on both the target and the anode, which will eventually degrade and perhaps even shut down the process when it is powered by a DC supply. This degradation is primarily due to an effect referred to as a "disappearing anode". The anode will disappear because it is eventually coated with an insulator, the same reactively formed dielectric compound deposited on the work piece.

One solution to this problem is to use a dual magnetron sputtering arrangement, as shown in FIG. 1. In this approach the pair of magnetrons A and B is driven by an AC supply that is electrically isolated from the plasma chamber 4 creating plasma 6. Therefore, they alternate roles between cathode and anode. So, after a brief time acting as an anode, and receiving a tiny deposition of dielectric, the magnetron will act as a cathode, sputtering conductive material as well as the little bit of dielectric that was deposited during the time it acted as an anode. As a result, a clean anode is always available to complete the current path.

Some industrial applications require delivery of power in a pulsed format where the power delivered in opposite polarities must be regulated independently. The pulsed dual magnetron sputtering arrangement used for depositing thin film coatings is such an example. The two magnetrons labeled "A" and "B" are situated in the plasma chamber, in a low-pressure gas environment. The power supply is connected to the magnetrons through gas-tight insulating feed-throughs. Loads of this type can have different voltages for each polarity. The voltages also vary dynamically with time and non-linearly with current. One example of a current versus voltage (I-V) curve for a dual magnetron arrangement is shown in FIG. 2. The current may vary non-linearly with voltage and I-V characteristics for positive and negative voltages may not be symmetrical. An example of the pulsed voltage and current waveforms as a function of time is shown in FIG. 3. The power supply can be set to have different amplitudes and pulse widths for positive and negative polarities, which can provide the capability of regulating the power delivered to each magnetron independently. The positive current can be smaller in proportion to the positive voltage than the negative current in proportion to the negative voltage. This is because the I-V characteristics for positive and negative voltages may not be symmetrical, as shown in FIG. 3. In practical applications these loads can vary in steady state operating voltage, and therefore large signal impedance, depending on physical configuration, magnetic field strength, process gas composition and pressure, target composition, and steady state current.

This technique was reported in G. Este, W. D. Westwood, J. Vac. Sci. Technology, A 6 (3), (May/June 1988), p. 1845–1848. Now, commonly referred to as dual magnetron sputtering (DMS) or dual cathode sputtering. This configuration is widely used in the deposition of low-emissivity ("low-e") coatings on architectural glass in large in-line coaters. Other significant applications include mirrors, flat panel displays, and anti-reflection (AR) coated glass. DMS is also employed in roll coaters for depositing coatings on plastic films for stick-on glare reduction filters as well as oxygen barriers for plastic food packaging films. An additional benefit of dual magnetron sputtering is the denser and smoother films it produces, due to a much higher flux of energetic ions at the substrate. Silver layers deposited on these smoother films have lower sheet resistance, and therefore lower emissivity, with the same optical transmission characteristics as taught in H. Schilling, et al., 'New layer system for architectural glass based on dual twin-magnetron sputtered $TiO_2$', 41st Annual Technical Conf. Proc., SVC (1998), p. 165–173.

Considerable effort has been expended to develop power supplies whose topologies are optimized for driving these dual magnetron systems. Both square-wave pulsed supplies and sinusoidal (or, resonant) power supplies have been used. High power sinusoidal AC supplies are commercially available. Descriptions of these power supplies have appeared in the technical literature and have been presented at conferences within the past few years as disclosed in T. Rettich, P. Wiedemuth, Journal of Non-Crystalline Solids 218 (1997) p. 50–53; T. Rettich, P. Wiedemuth, 'New application of medium frequency sputtering for large area coating', 41st Annual Technical Conf. Proc., SVC (1998), p. 182–186; and G. Wallace, Thin Solid Films 351 (1999) p. 21–26. The AC power supplies on the market today control and measure the total power delivered to the two magnetrons. Measurement and control of the power, current and voltage for individual magnetrons is not yet available in sinusoidal AC supplies.

Pulsed supplies inherently offer more flexibility in control of the process. They provide the capability of independently regulating the power delivered to each magnetron. This has some advantages for existing processes, and enables the implementation of new processes. First, independent regulation of power to each magnetron can force each magnetron to receive the same power. Consequently, the racetracks erode at the same rate. When a resonant supply is used, an impedance difference between the two magnetrons can result in faster erosion of one target, which unnecessarily reduces the time between preventative maintenance cycles.

Second, it is possible to intentionally operate the two magnetrons at different powers. If one target develops a tendency to arc, its power can be reduced to the point where it arcs at an acceptable rate, and, sometimes, the power to the other magnetron can be increased to compensate and maintain the same deposition rate from the pair. Third, independent regulation enables the creation of controlled mixtures of materials in the film when dissimilar materials are used for the magnetron targets. This would allow the creation of films with customized or graded indexes of refraction. For example, SiO2 can be deposited with a refractive index of about 1.5 and TiO2 can be deposited with a refractive index of about 2.4. If a dual magnetron sputtering arrangement is configured with one Si target and one Ti target, the ratio of Ti to Si can be controlled by controlling the power to each of the magnetrons. Therefore, in principle, it is possible to "dial" the refractive index anywhere between 1.5 and 2.4.

Pulsed power supplies used in dual magnetron sputtering need to be rated at 120 to 200 kW with the ability to regulate on voltage, current, or power are disclosed in P. Greene, R. Dannenberg, 'Modelling of production scale reactive deposition', 42nd Annual Technical Conf. Proc., SVC (1999) p. 23–28; and U. Heister, et al., 'Recent developments on optical coatings sputtered by dual magnetron using a process regulation system', 42nd Annual Technical Conf. Proc., SVC (1999), p. 34–38. These supplies should be able to deliver full power over a 2 to 1 voltage range and must have sophisticated arc management capability offering arc prevention and recovery and very low arc energy. They should also offer variable frequency. In general, a process should be run at the lowest frequency consistent with an acceptable arc rate in order to achieve the highest deposition rate. Some processes require periodic cleaning cycles, and, in this case, the ability to run at higher frequencies for cleaning is desirable.

A square wave voltage source supply has been disclosed in U.S. Pat. No. 5,303,139 issued in April 1994 to G. Mark, entitled "Low frequency, pulsed, bipolar power supply for a plasma chamber". Pulsed voltage source supplies typically demonstrate slow current rise and high peak currents into an arc. Consequently, they have had limited commercial acceptance for the dual magnetron sputtering application. Further work has focused on the development of pulsed current source supplies as disclosed in U.S. Pat. No. 5,777,863 issued July, 1998 to D. Kovalevskii and M. Kishinevsky, entitled "Low-frequency modulated current mode power supply for magnetron sputtering cathodes"; U.S. Pat. No. 5,917,286 issued June, 1999 to R. A. Scholl and D. J. Christie, entitled "Pulsed direct current power supply configurations for generating plasmas"; and U.S. Pat. No. 6,005,218 issued December 1999 to H. Walde, et al. entitled "Process and circuit for the bipolar pulse-shaped feeding of energy into low pressure plasmas.

One problem with asymmetric bipolar pulsed supplies is ground insulation. Those skilled in the art know that a simple output transformer similar to those used in AC power supplies may saturate when voltage waveform applied to the primary winding is not balanced, meaning that average input voltage is not zero. In the above-mentioned patent of Kovalevskii et al, using a low frequency isolating transformer at the input section of the power supply solved this problem. First, a low frequency transformer tends to be very large and heavy at high power requirements. Second, absence of an output transformer reduces the load voltage range of the power supply since the load cannot be matched by changing transformer taps.

It is an object of this invention to provide a way to use an output transformer with a pulsed power supply while preventing saturation.

It is another object of this invention to provide an output transformer that would allow for broader load range and more efficient use of power devices in the pulsed power supply.

It is yet another object of this invention to provide a power supply that has a smaller size, footprint, and weight due to the elimination of the low frequency input transformer.

SUMMARY OF THE INVENTION

There is provided by this invention a novel pulsed DC power supply for dual magnetron sputtering applications that utilizes a transformer that provides the functions of isolation and voltage level transformation. This provides isolation with the possibility of transforming the output voltage of the unit to a different level. The power supply output current and the voltage-current (V-I) characteristics of the process load determine the output voltage. A Hall effect sensor is used to directly sense the flux in the magnetic circuit. A control circuit uses this signal to set the duty cycle of a power supply to achieve the condition where the average voltage on the primary of the transformer is zero, a necessary condition to prevent the transformer from saturating. Additional circuitry prevents saturation during a single pulse.

BRIEF DESCRIPTION OF THE PREFERRED EMBODIMENT

Figure 1:
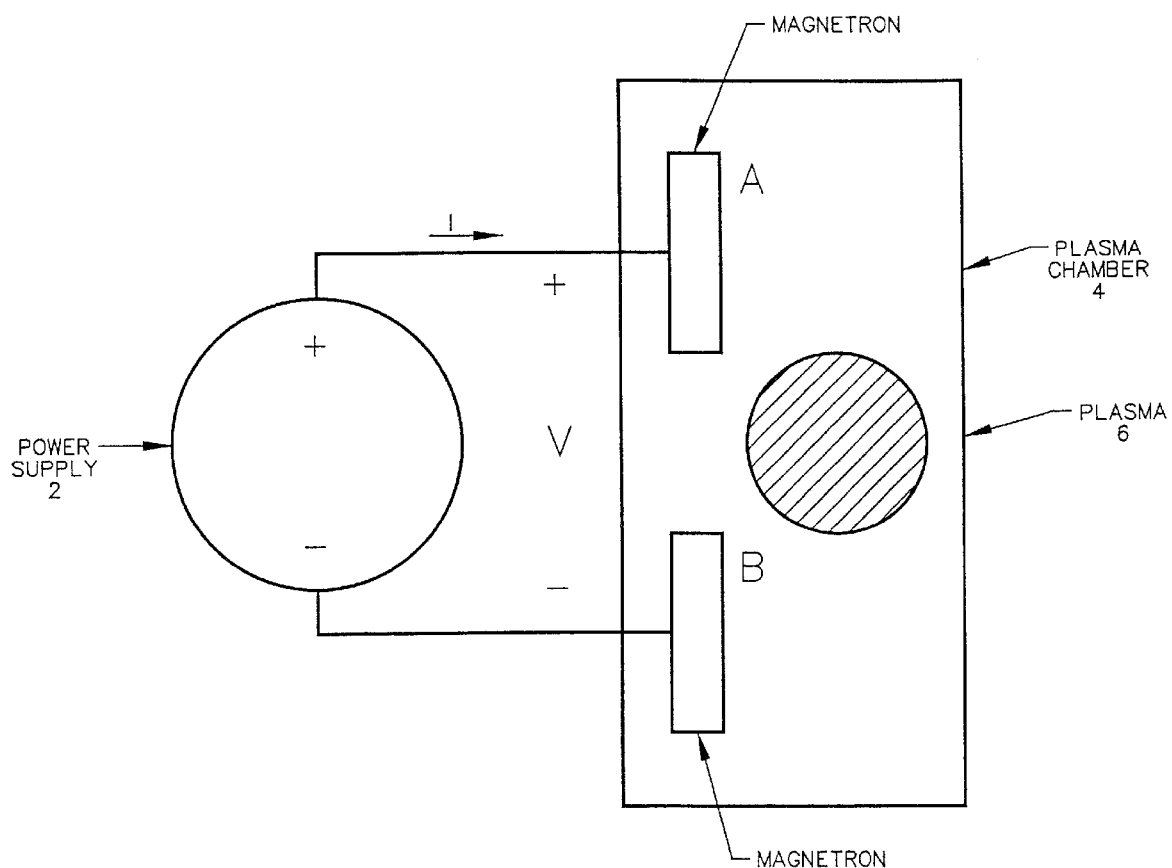
FIG. 1 illustrates a schematic diagram of a prior art dual magnetron sputtering arrangement.
Figure 2:
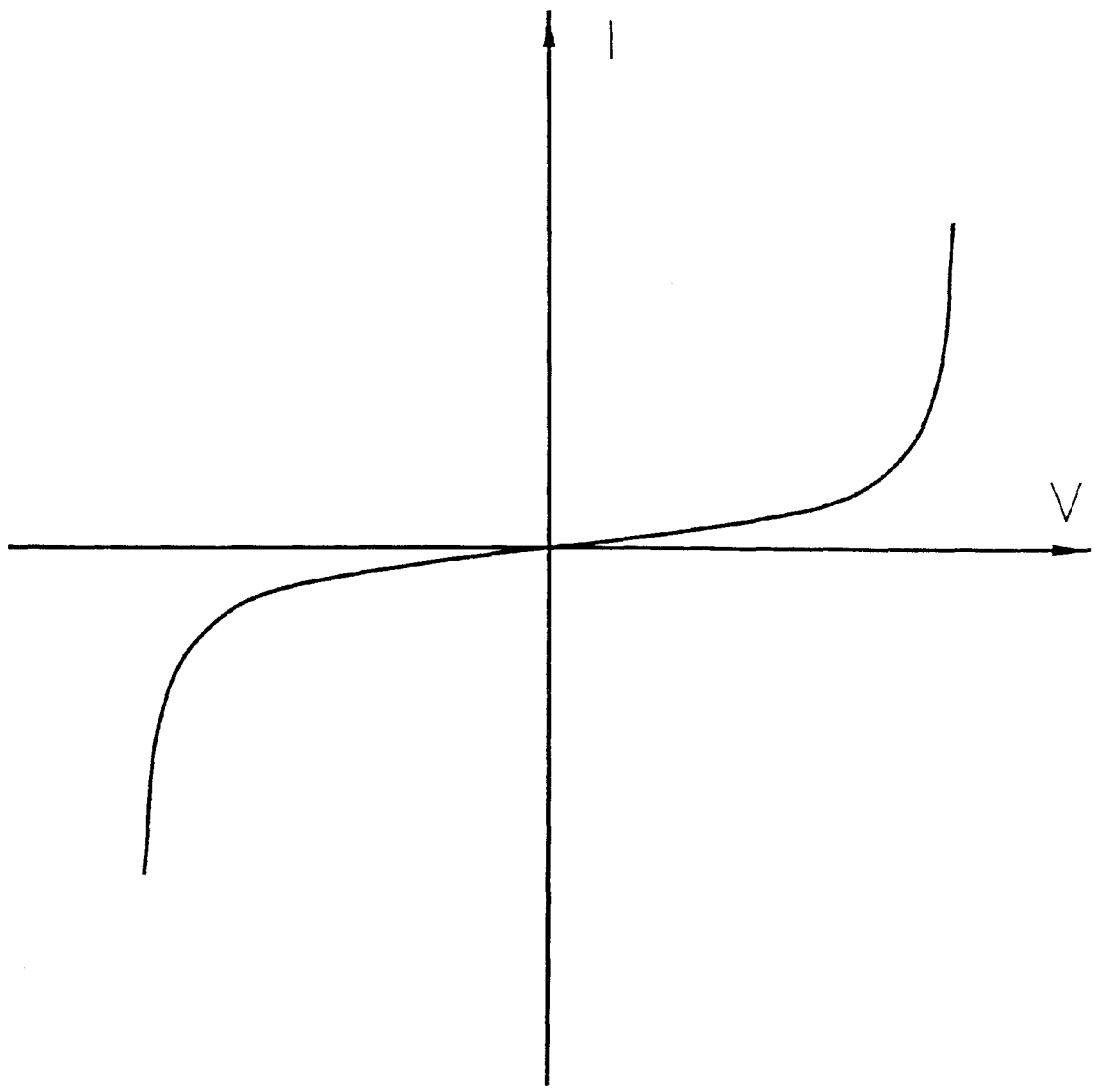
FIG. 2 illustrates an example of a voltage-current (V-I) curve for a prior art dual magnetron sputtering arrangement.
Figure 3:
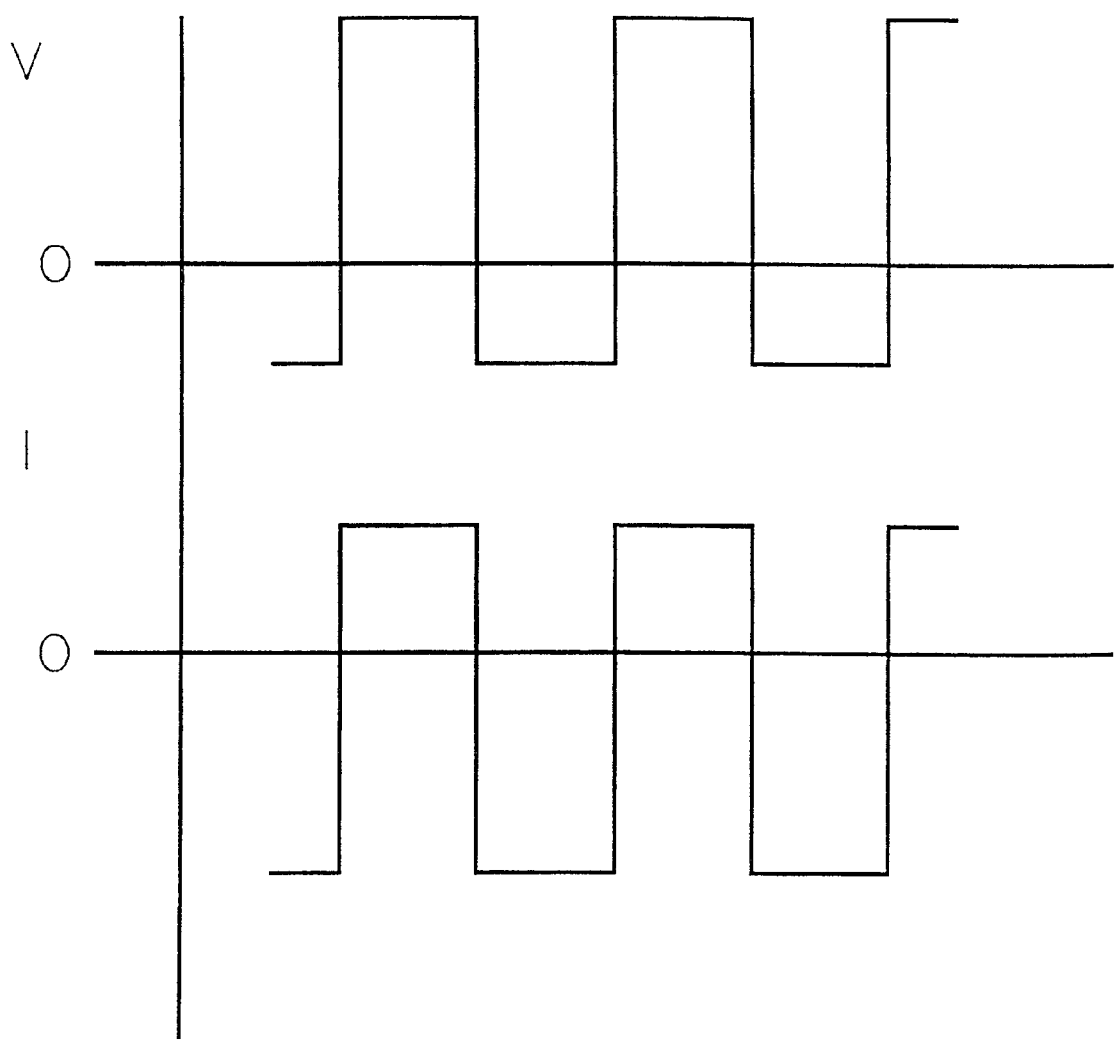
FIG. 3 illustrates prior art pulsed voltage and current waveforms with respect to time with different V-I characteristics for positive and negative polarities.
Figure 4:
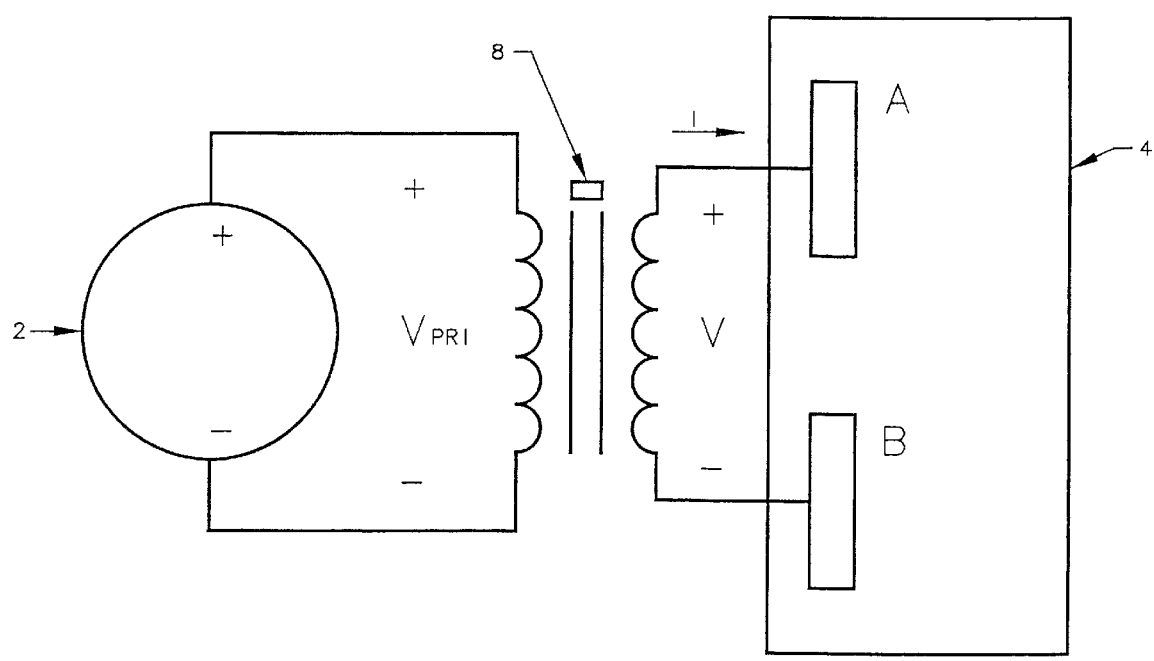
FIG. 4 illustrates a schematic diagram of a dual magnetron sputtering arrangement driven by a power supply whose output is coupled by a transformer incorporating the principles of this invention.

A schematic of a dual magnetron sputtering arrangement driven by a power supply with an output transformer 8 is shown in FIG. 4. The transformer provides the functions of isolation and voltage level transformation. The possibility of different voltages and currents for each polarity can imply the possibility of saturating the transformer since the average voltage at the transformer primary usually must equal zero to keep the transformer from saturating. Isolation from the mains is required because the mains power and the plasma chamber are typically referenced to earth ground.

Failure to provide isolation results in an undesired electrical current path. This will cause unpredictable behavior from the process and possible failure of the power supply. The power supply output current and the voltage-current (V-I) characteristics of the process load determine the output voltage. It is often desirable to drive a process whose operating voltage falls outside the capabilities of the power supply. In that case, the utility of the power supply is increased by the addition of a output transformer. The output transformer is directly DC coupled to the output of the power supply, and is therefore prone to saturation. The long-term average condition required to prevent saturation is that the average input voltage (DC voltage component) to the primary of the transformer is zero. In the short term, the voltage-time product must not exceed a set value, or the peak flux will exceed the maximum allowed by the magnetic material. A Hall effect sensor is used to directly sense the flux in the magnetic circuit. The control circuit uses this signal to set the duty cycle of the power supply to achieve the condition where the average voltage on the primary of the transformer is zero.

Figure 5:
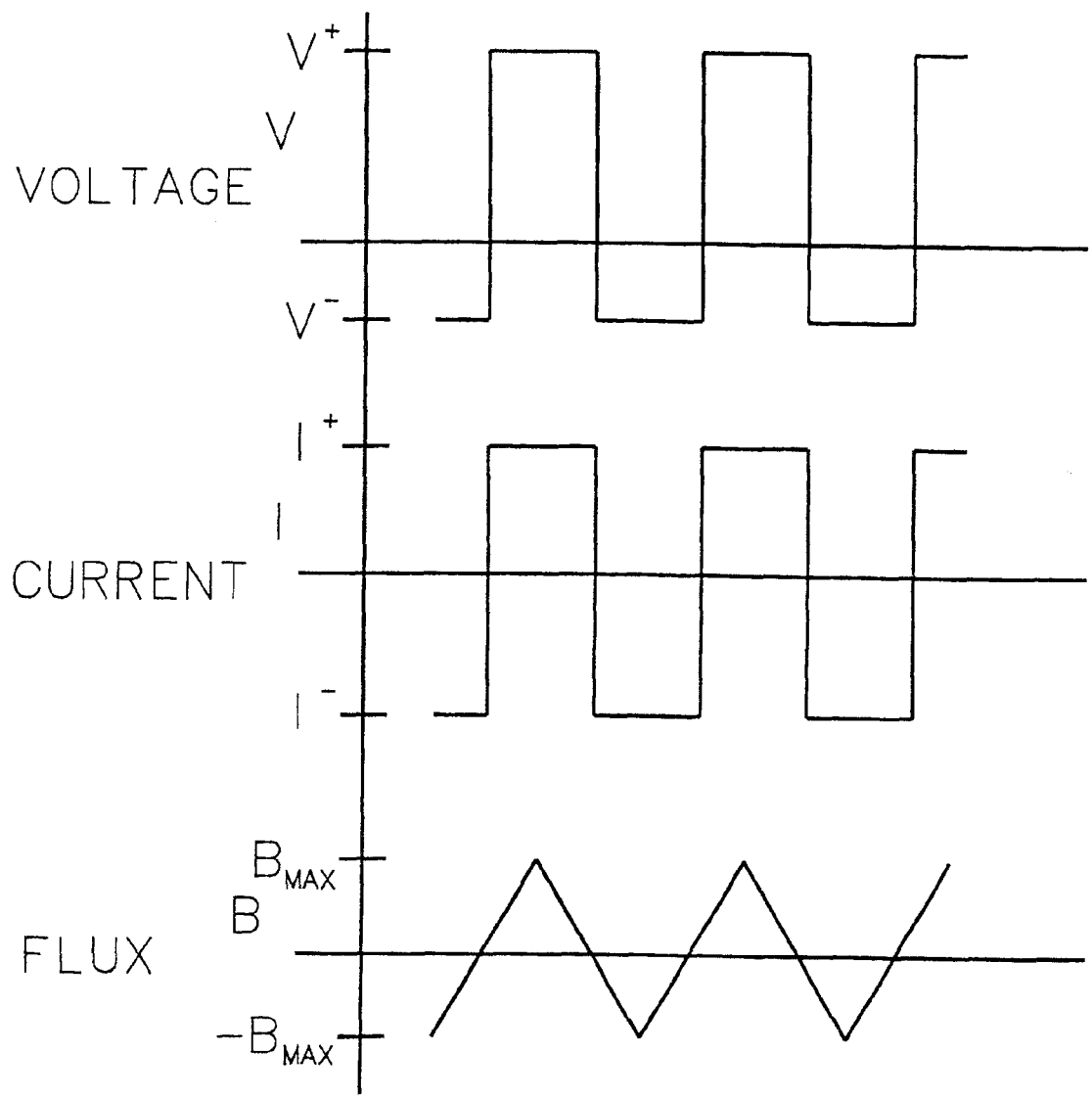
FIG. 5 illustrates example pulsed voltage and current waveforms and transformer flux.

FIG. 5 shows waveforms as a function of time for this circuit in operation. The negative voltage can be less than the positive voltage, so the negative pulse usually must be on for a longer time in order to make the average voltage zero. This condition also can make the change in flux in the positive direction equal to the change in flux in the negative direction.

The invention may involve several aspects that may allow the operation of a pulsed power supply, such as the Astral 200™ supply of the assignee, with an output transformer. These aspects include (but are not limited to): delivering different powers in different polarities through an output transformer, using a flux control loop and the ideas for implementing the control system, and using a separate magnetic circuit to tap off a sample of the flux, since an absolutely calibrated flux measurement may not be required.

This invention provides a means of regulating power delivered through a transformer separately for positive and negative polarities. The load can be resistive or a plasma, but is not limited to the two. The reason is that the peak power can go up faster than linearly as the voltage is increased. For a resistor, the peak power may go as the square of the voltage. For a plasma load, the peak power typically increases as a power higher than two with respect to the voltage. So, as voltage increases, the duty cycle may need to be adjusted to prevent saturation, which can tend to reduce average power in that polarity linearly, but peak power may go up much faster than linearly with voltage. This can mean that small changes in duty cycle may be sufficient to prevent saturation when fairly large changes are made in the power delivered in one polarity versus the other. A feedback loop can be used to prevent saturation of the transformer. This can be accomplished by sensing the flux in the transformer core and controlling the duty cycle to balance the positive and negative flux. A separate circuit can be used to prevent saturation on a pulse-by-pulse basis. The flux control loop can operate in conjunction with the power control loops for the positive and negative polarities. The flux control loop may need to be fast enough that changes made by the power control loops do not cause saturation of the transformer.

Figure 6A:
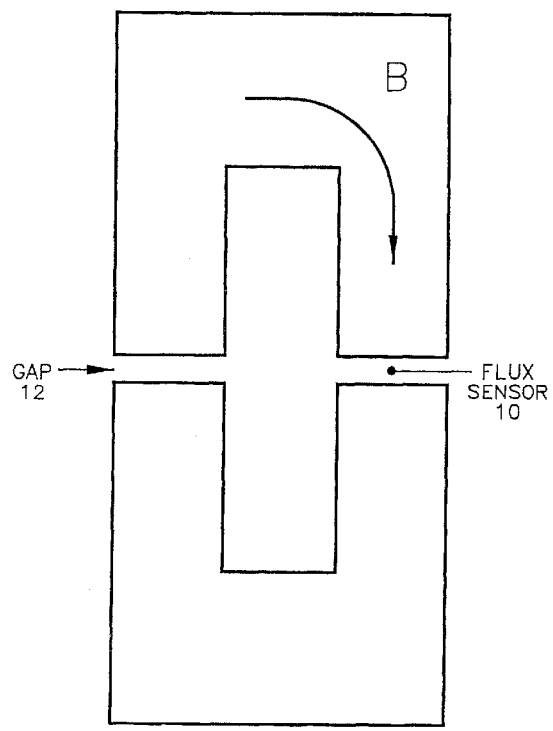
FIG. 6a illustrates a means of sampling the flux by inserting the flux sensor in a gap in the magnetic core of the transformer.

A flux sensor can be used to determine two things about the flux in the transformer core. The first is the relative magnitudes and signs of the minimum and the maximum flux. The second is the time when the flux is at zero. This can be accomplished without absolute amplitude calibration. An accurate null, or zero flux, calibration may be sufficient. If the transformer core has a gap of sufficient dimension the flux sensor 10 can be inserted in the gap to measure the flux directly as shown in FIG. 6a. It is common to use magnetic cores with no gap in order to maximize the magnetizing inductance and therefore minimize the magnetizing current at the primary of the transformer. In that case, sensing the flux can become more difficult. Using a magnetic circuit to route some of the flux inside the core through a gap where the flux sensor is located may solve the problem.

Figure 6B:
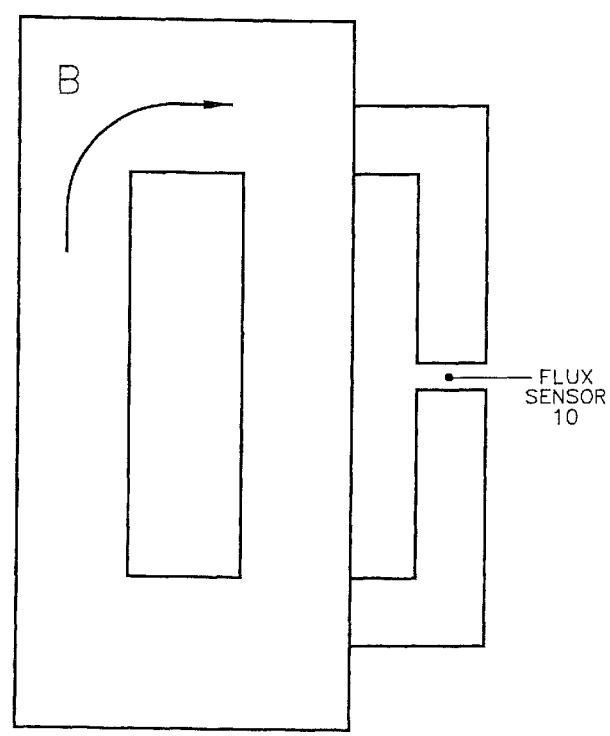
FIG. 6b illustrates a means of sampling the flux in the ungapped transformer core.
Figure 6C:
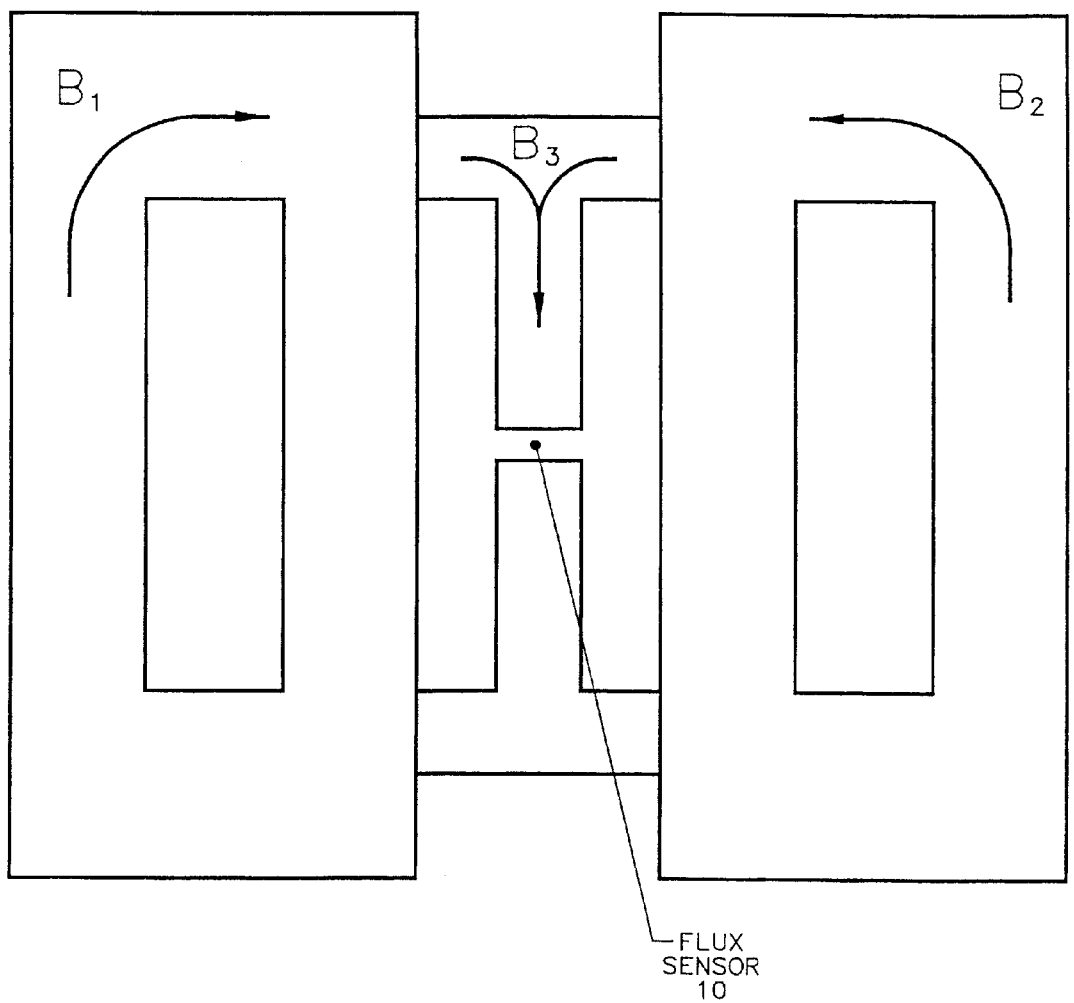
FIG. 6c shows a means of sampling the flux in two ungapped transformer cores with a single flux sensor.

The configuration in FIG. 6b measures the flux in one core. A means of averaging the flux measured in two adjacent cores is shown in FIG. 6c. A commercially available Hall Effect sensor may be chosen for this design. Other types of flux sensors could be used as well, including, but not limited to, the magneto-resistive type or optical types based on Faraday rotation.

Figure 7:
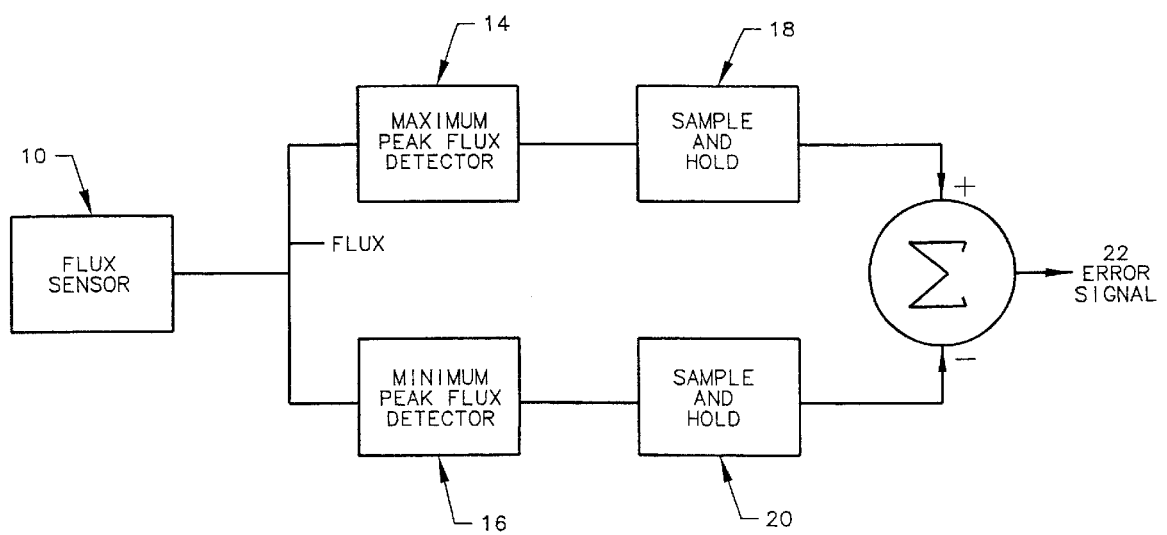
FIG. 7 shows a block diagram of a system for controlling the flux in the output transformer using the signal from the flux sensor.

The flux sensor can be used in conjunction with the circuit in FIG. 7 to generate a duty cycle control signal. The objective of the duty cycle controller may be to make the maximum and minimum peak fluxes equal in magnitude and opposite in sign. The maximum peak flux detector 14 can produce a signal that is captured by a sample and hold circuit 18 every cycle. The minimum peak flux detector 16 can produce a signal that is captured by a second sample and hold circuit 20 every cycle. The outputs of the two sample and hold circuits 18 and 20 may be summed together to generate an error signal 22. When the error signal 22 is zero it may indicate that the magnitudes of the maximum and minimum peak fluxes are equal and that their signs are opposite. When the error signal is not zero, it may indicate that the duty cycle should be changed in order to make the error signal zero. This can be accomplished by feeding the signal to the input of an integrator whose output controls the duty cycle. It could also be accomplished by digitally stepping the duty cycle until the error signal is zero. There are numerous other control algorithms that could be used to control the duty cycle. The important thing may be that the duty cycle is controlled to make the error signal zero.

Variations in process parameters, or rapid transients in the power supply can occur faster than the flux control loop can respond. Therefore, it may be necessary to prevent the transformer from saturating on a single pulse in order to prevent damage to the power supply or consistent disruptions to the plasma process. This may require a means of accurately estimating the peak flux. The magnetic flux swing of a transformer can be expressed mathematically as:

$$\Delta B = \int_{t_1}^{t_2} \frac{V}{NA} dt$$

Figure 8:
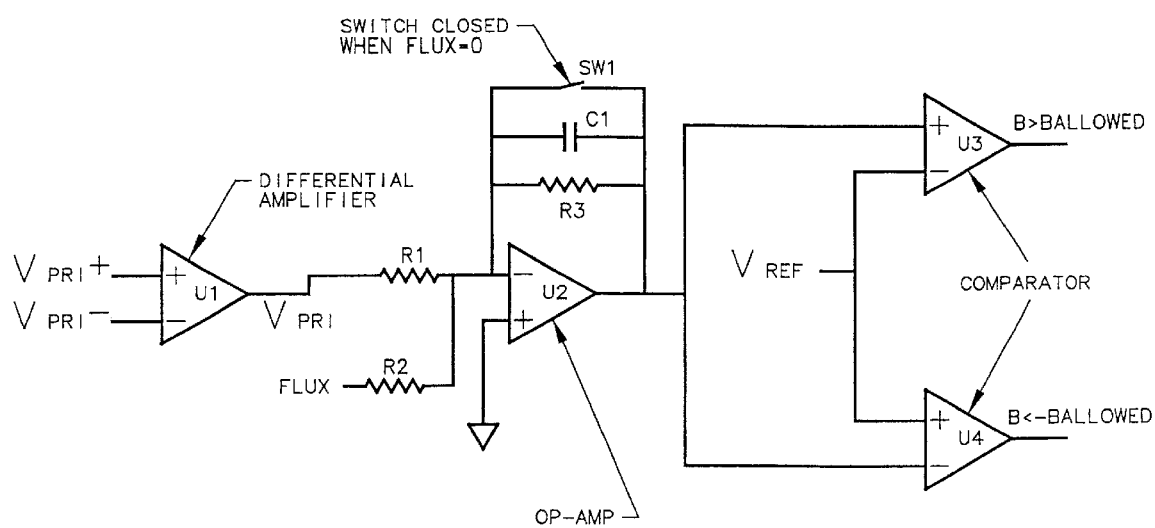
FIG. 8 is a schematic diagram of a circuit to prevent saturation of the transformer on a pulse by pulse basis.

Where:
B is the swing in magnetic flux in Tesla
V is the voltage at the primary of the transformer
N is the number of primary turns of the transformer
A is the effective magnetic area of the transformer core
t1 is the time at the beginning of the flux swing
t2 is the time at the end of the flux swing The electronic circuit shown in FIG. 8 can be used to evaluate this equation. The differential amplifier U1 may make a measurement of the transformer primary voltage. An integrator circuit comprised of op-amp U2 and R1, R3, C1, and SW1 can be used to estimate the peak flux in the transformer. The flux sensor can provide a signal indicating that the flux is zero. This can zero the integrator by closing switch SW1, corresponding to t1 in the equation. When the flux changes slightly from zero the integrator may be allowed to operate. If the positive flux is greater than, or if the negative flux is less than, a preset threshold corresponding to the maximum allowed flux magnitude, then a comparator may be tripped which can shut off the output of the power supply before the transformer is saturated. A small portion of the flux signal can also be added to the integrator through resistor R2 to compensate for small offset currents in practical op-amps. This can cause the integrator to always go in the correct direction for small values of the primary voltage. R3 may be a large value resistor which has little effect on the operation of the circuit for short times, but which keeps the op-amp from drifting to saturation when the switch SW1 is open for long times when the power supply needs to shut down to respond to an arc or other temporary disruption in the process.

It would also be possible to use magnetizing current to control the transformer. The magnetizing current can be estimated by subtracting the secondary current referred to the primary side by the turns ratio from the primary current. Substituting magnetizing current for flux can use the control circuit in FIG. 7. The objective of the control system would be to make the peak positive and negative magnetizing current equal in magnitude and opposite in sign. Shutting off the power supply when a maximum allowed magnetizing current is reached would prevent saturation.

As can be easily understood from the foregoing, the basic concepts of the present invention may be embodied in a variety of ways. It involves both power control techniques, the processes described, product from such processes, as well as power supplies. In this application, the control techniques are disclosed as part of the results shown to be achieved by the various devices described and as steps that are inherent to utilization. They are simply the natural result of utilizing the devices as intended and described. In addition, while some devices are disclosed, it should be understood that these not only accomplish certain methods but also can be varied in a number of ways. Importantly, as to all of the foregoing, all of these facets should be understood to be encompassed by this disclosure.

The reader should be aware that the specific discussion may not explicitly describe all embodiments possible; many alternatives are implicit. It also may not fully explain the generic nature of the invention and may not explicitly show how each feature or element can actually be representative of a broader function or of a great variety of alternative or equivalent elements. Again, these are implicitly included in this disclosure. Where the invention is described in device-oriented terminology, each element of the device implicitly performs a function. Apparatus claims may not only be included for the device described, but also method or process claims may be included to address the functions the invention and each element performs.

Further, each of the various elements of the invention and claims may also be achieved in a variety of manners. This disclosure should be understood to encompass each such variation, be it a variation of an embodiment of any apparatus embodiment, a method or process embodiment, or even merely a variation of any element of these. Particularly, it should be understood that as the disclosure relates to elements of the invention, the words for each element may be expressed by equivalent apparatus terms or method terms—even if only the function or result is the same. Such equivalent, broader, or even more generic terms should be considered to be encompassed in the description of each element or action. Such terms can be substituted where desired to make explicit the implicitly broad coverage to which this invention is entitled. Regarding this last aspect, as but one example, the disclosure of a "switch" should be understood to encompass disclosure of the act of "switching"—whether explicitly discussed or not—and, conversely, were there only disclosure of the act of "switching", such a disclosure should be understood to encompass disclosure of a "switch" and even a means for "switching". Such changes and alternative terms are to be understood to be explicitly included in the description.

We claim:

1. A power supply for generating voltage pulses to first and second magnetron devices in a plasma chamber, comprising:

a source of pulsed DC electrical power connected to the primary of an isolation transformer;

the secondary output of the transformer is connected to first and second magnetron sputtering devices;

a flux sensor disposed to detect the flux in the transformer core; and a control circuit connected to the flux sensor to control the duty cycle of the transformer to prevent saturation and to independently regulate delivered power for each of the opposite polarities of the transformer output current.

2. A power supply for generating voltage pulses to first and second magnetron devices in a plasma chamber as recited in claim 1 wherein the control circuit is disposed to make the maximum and minimum peak transformer fluxes equal in magnitude and opposite in sign to prevent saturation.

3. A power supply for generating voltage pulses to first and second magnetron devices in a plasma chamber as recited in claim 1 wherein the flux sensor is a Hall effect sensor.

4. A power supply for generating voltage pulses to first and second magnetron devices in a plasma chamber as recited in claim 1 further comprising a control circuit for estimating the peak flux of the transformer to prevent saturation.

5. A method of supplying pulsed DC power to first and second magnetron devices in a plasma chamber comprising the steps of:

generating DC voltage pulses;

supplying the DC voltage pulses to the primary of an isolation transformer;

connecting the output of the isolation transformer to first and second magnetron devices in a plasma chamber;

detecting the flux of the isolation transformer;

controlling the flux of the transformer such that the maximum and minimum peak transformer fluxes are equal in magnitude and opposite in sign to prevent saturation; and independently regulating delivered power for each of the opposite polarities of the transformer output current.

6. A method of supplying pulsed DC power to first and second magnetron devices in a plasma chamber as recited in claim 5 further comprising the step of accurately estimating the peak transformer flux to prevent saturation.

* * * * *